(12) United States Patent
Chen et al.

(10) Patent No.: US 11,011,584 B2
(45) Date of Patent: May 18, 2021

(54) ARRAY SUBSTRATE AND FABRICATING METHOD THEREOF, AND DISPLAY DEVICE

(71) Applicant: BOE TECHNOLOGY GROUP CO., LTD., Beijing (CN)

(72) Inventors: Lei Chen, Beijing (CN); Wei Quan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/561,448

(22) Filed: Sep. 5, 2019

(65) Prior Publication Data
US 2020/0266248 A1 Aug. 20, 2020

(30) Foreign Application Priority Data
Feb. 19, 2019 (CN) .......................... 201910121362.9

(51) Int. Cl.
*H01L 27/32* (2006.01)
*H01L 51/52* (2006.01)
(Continued)

(52) U.S. Cl.
CPC ...... *H01L 27/3211* (2013.01); *H01L 51/0097* (2013.01); *H01L 51/5253* (2013.01);
(Continued)

(58) Field of Classification Search
None
See application file for complete search history.

(56) References Cited

U.S. PATENT DOCUMENTS

2001/0011868 A1* 8/2001 Fukunaga ........... H01L 51/5234
313/506
2015/0115253 A1* 4/2015 Ha ....................... H01L 51/5209
257/40
(Continued)

FOREIGN PATENT DOCUMENTS

CN 1606387 A 4/2005
CN 104078489 A 10/2014
(Continued)

OTHER PUBLICATIONS

First Office Action for CN Patent Application No. 201910121362.9 dated Oct. 12, 2020.

*Primary Examiner* — Evren Seven
(74) *Attorney, Agent, or Firm* — Thomas|Horstemeyer, LLP

(57) ABSTRACT

An array substrate includes a back plate including planar and curved portions; a light emitting layer at the back plate including first and second light emitting units that are spaced apart from each other, and a wavelength of a light emitted by the first light emitting unit being greater than a wavelength of a light emitted by the second light emitting unit; a pixel defining layer at a first side of the back plate and between the first light emitting unit and the second light emitting unit, the pixel defining layer including a first pixel defining region on the curved portion and adjacent to the first light emitting unit and close to the planar portion; and a correction layer at a side of the first pixel defining region away from the back plate for absorbing and reflecting the light emitted by the first light emitting unit.

14 Claims, 4 Drawing Sheets

(51) Int. Cl.
*H01L 51/00* (2006.01)
*H01L 51/56* (2006.01)

(52) U.S. Cl.
CPC .......... *H01L 51/5271* (2013.01); *H01L 51/56* (2013.01); *H01L 27/3246* (2013.01); *H01L 2251/5338* (2013.01)

(56) References Cited

U.S. PATENT DOCUMENTS

| | | | |
|---|---|---|---|
| 2015/0187857 A1 | 7/2015 | Negishi et al. | |
| 2016/0064694 A1* | 3/2016 | Choi | H01L 27/3211 257/40 |
| 2017/0117333 A1* | 4/2017 | Kikuchi | G09F 9/30 |
| 2017/0207276 A1* | 7/2017 | Miyamoto | G06F 3/04164 |
| 2017/0250371 A1* | 8/2017 | Kamiya | H01L 27/3211 |
| 2018/0047798 A1* | 2/2018 | Abe | H01L 27/3272 |
| 2018/0061914 A1* | 3/2018 | Jeong | H01L 27/3248 |
| 2018/0138450 A1* | 5/2018 | Park | H01L 51/5256 |
| 2018/0198093 A1* | 7/2018 | Yu | H01L 51/5256 |
| 2019/0004360 A1* | 1/2019 | Aoki | G02F 1/13452 |
| 2019/0019979 A1* | 1/2019 | Lee | H01L 51/5218 |
| 2019/0123112 A1* | 4/2019 | Lee | H01L 51/0097 |
| 2019/0214595 A1* | 7/2019 | Park | G06F 3/0443 |
| 2020/0035768 A1* | 1/2020 | Okabe | H01L 51/5012 |
| 2020/0127056 A1* | 4/2020 | Guo | H01L 51/5284 |
| 2020/0264356 A1* | 8/2020 | Lee | G02F 1/133528 |
| 2020/0373372 A1* | 11/2020 | Chung | H01L 27/3258 |

FOREIGN PATENT DOCUMENTS

| | | |
|---|---|---|
| CN | 105206758 A | 12/2015 |
| CN | 107658331 A | 2/2018 |
| JP | 2003017272 A | 1/2003 |

\* cited by examiner

ARRAY SUBSTRATE AND FABRICATING METHOD THEREOF, AND DISPLAY DEVICE

CROSS REFERENCE TO RELATED APPLICATION

This application is based upon, and claims the benefit of and priority to, Chinese Patent Application No. 201910121362.9, filed on Feb. 19, 2019, the entire contents thereof being incorporated by reference herein.

TECHNICAL FIELD

The present disclosure relates to the field of display technologies and, more particularly, to an array substrate, a fabricating method thereof, and a display device.

BACKGROUND

With the development and improvement of technology, flexible display devices have become more widely used. For example, a flexible display panel is used in curved screen mobile phones, and generally, the flexible display panel has a curved area.

Presently, in the curved area of the flexible display panel, the color of the display panel is abnormal due to different degrees of attenuation of light of different wavelengths when viewed from the front of the display panel. For example, red, green, and blue lights have different degrees of luminance attenuation at a certain angle, and attenuation of the red light is slower, causing redness in the curved area of the display panel.

It should be noted that the information disclosed in the above background section is only for enhancement of understanding of the background of the present disclosure, and thus, may include information that does not constitute prior art known to those of ordinary skill in the art.

SUMMARY

According to an aspect of the present disclosure, an array substrate includes:

a back plate comprising a planar portion and a curved portion;

a light emitting layer at a first surface of the back plate, the light emitting layer comprising first light emitting units and second light emitting units that are spaced apart from each other, and a wavelength of a light emitted by the first light emitting unit being greater than a wavelength of a light emitted by the second light emitting unit;

a pixel defining layer at a first side of the back plate and between the first light emitting unit and the second light emitting unit, the pixel defining layer comprising a first pixel defining region on the curved portion and adjacent to the first light emitting unit and close to the planar portion; and a correction layer at a side of the first pixel defining region away from the back plate for absorbing and reflecting the light emitted by the first light emitting unit.

According to an implementation of the present disclosure, the first light emitting unit is a red light unit.

According to an implementation of the present disclosure, the array substrate includes:

a first protective layer disposed at a side of the light emitting layer away from the back plate, the correction layer being disposed at the side of the light emitting layer away from the back plate.

According to an implementation of the present disclosure, the array substrate further includes: a second protective layer disposed at a side of the correction layer away from the first protective layer.

According to an implementation of the present disclosure, a material of the correction layer comprises at least one of magnesium and silver.

According to an implementation of the present disclosure, the correction layer has a thickness of 3 to 8 nm.

According to an implementation of the present disclosure, the first protective layer has a thickness of 10 to 300 nm.

According to an implementation of the present disclosure, the second protective layer has a thickness of 300 to 1500 nm.

According to a second aspect of the present disclosure, a fabricating method of an array substrate is provided. The fabricating method includes:

providing a back plate comprising a planar portion and a curved portion;

forming a light emitting layer and a pixel defining layer on the back plate, the pixel defining layer dividing the light emitting layer into at least a first light emitting unit and a second light emitting unit, wherein a wavelength of a light emitted by the first light emitting unit is greater than a wavelength of a light emitted by the second light emitting unit, and the pixel defining layer comprises a first pixel defining region on the curved portion, and adjacent to the first light emitting unit and close to the planar portion;

forming a correction layer at a side of the first pixel defining region away from the back plate. According to an implementation of the present disclosure, the fabricating method further includes:

forming a second protective layer at a side of the correction layer away from the first protective layer.

According to an implementation of the present disclosure, forming the correction layer at the side of the first pixel defining region away from the back plate includes:

evaporating magnesium or silver at a side of the first pixel defining region away from the back plate to form the correction layer.

According to a third aspect of the present disclosure, a display device is provided including the array substrate of present disclosure.

It should be understood that the above general description and the following detailed description are intended to be illustrative and not restrictive, and do not limit the present disclosure.

BRIEF DESCRIPTION OF THE DRAWINGS

The accompanying drawings that are incorporated in and constitute part of the specification, show the embodiments of the present disclosure, and are intended to explain the principle of the present disclosure together with the description. It is apparent that the accompanying drawings in the following description are only some of the embodiments of the present disclosure, and other drawings may be obtained from these accompanying drawings by those skilled in the art without any creative work.

DETAILED DESCRIPTION

Figure 1:
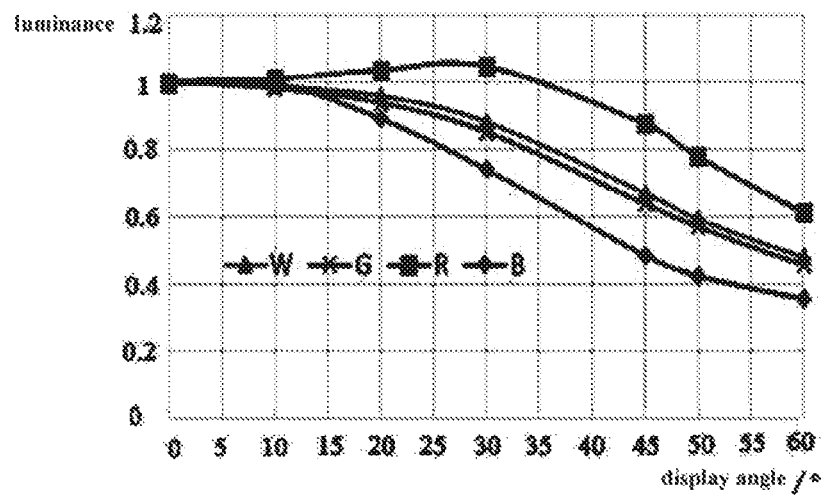
FIG. 1 is a luminance-viewing angle curve provided by an embodiment of the present disclosure.

Example embodiments will now be more fully described with reference to the accompanying drawings. However, the example embodiments can be embodied in a variety of forms and should not be construed as being limited to the embodiments set forth herein. Rather, these embodiments are provided so that this disclosure will be thorough and complete, and the concepts of the example embodiments will be fully given to those skilled in the art. The same reference numerals in the drawings denote the same or similar structures and thus, their detailed descriptions will be omitted.

Although the relative terms, such as "on", "below", "upper" and "lower", are used in the specification to describe the relative relationship of one component to another component, these terms are used in this specification for convenience only, for example, a direction in the example according to the accompanying drawings. It should be understood that if the device is turned upside down, the "upper" component described above will become a "lower" component. When a structure is "on" another structure, it is possible that the structure is integrally formed on another structure, or that the structure is "directly" disposed on another structure, or that the structure is "indirectly" disposed on the other structure through other structures.

The terms, such as "a", "an", "the" and "said", are used to indicate the presence of one or more elements/components. The terms "comprise", "include", "have", "contain", and their variants are used to be open-type and are meant to include additional elements/components, etc., in addition to the listed elements/components/etc. The terms "first", "second", etc. are used only as marks, rather than limitation for the number of objects.

A flexible display panel usually has a curved portion, and the curved portion is displayed under a large viewing angle when viewed from the front. At this time, lights having different wavelengths have different attenuation rates when viewed from the front, thereby causing display abnormality. For example, currently used pixels include a red sub-pixel, a green sub-pixel, and a blue sub-pixel. The luminance-viewing angle curves of red, green, blue, and white light under a large viewing angle are shown in FIG. 1, wherein the abscissa shows the display angle, and the ordinate shows the luminance. It can be obtained from FIG. 1 that the red light has the slowest attenuation rate, followed by attenuation rates of white light, green light, and blue light. Since the red light has the slowest attenuation rate, redness tends to appear in the curved portion of the flexible display panel.

Figure 3:
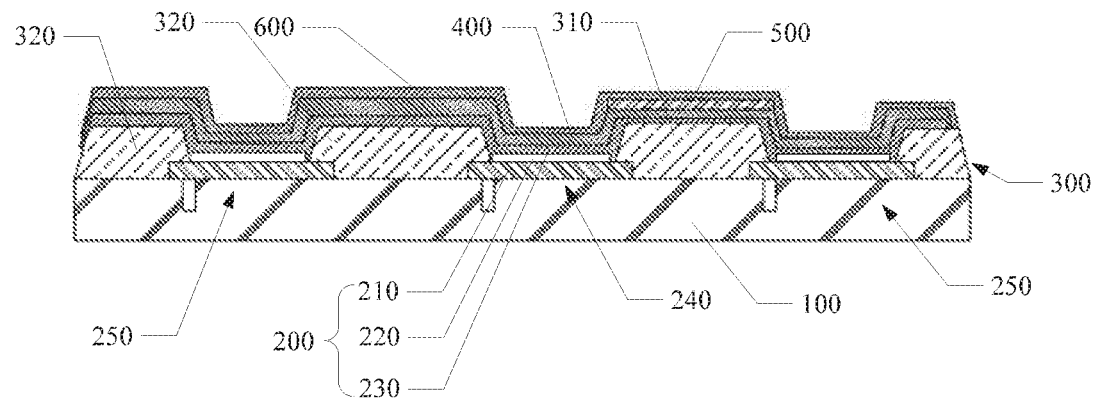
FIG. 3 is a schematic structural view of a left curved portion of an array substrate according to an embodiment of the present disclosure.

An array substrate is provided in the first embodiment. As shown in FIG. 3, the array substrate includes: a back plate 100, a light emitting layer 200, a pixel defining layer 300, and a correction layer 500.

Figure 2:
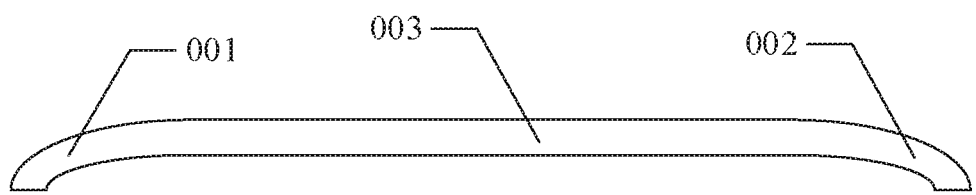
FIG. 2 is a schematic view of a flexible display panel according to an embodiment of the present disclosure.

The back plate 100 includes a planar portion 003 and curved portions 001, 002 (see FIG. 2). The light emitting layer 200 is disposed at a first surface of the back plate 100. The light emitting layer 200 includes a plurality of first light emitting units 245 and a plurality of second light emitting units 250 spaced apart from one another. The pixel defining layer 300 is disposed at the first surface of the back plate 100, and the first light emitting unit 240 and the second light emitting unit 250 are divided by the light emitting layer 200. A wavelength of light emitted by the first light emitting unit 240 is greater than a wavelength of light emitted by the second light emitting unit 250. The correction layer 500 is disposed at a side of the first pixel defining region 310 away from the back plate for absorbing and reflecting the light emitted by the first light emitting unit 240. The first pixel defining region 310 is a pixel defining layer 300 adjacent to the first light emitting unit 240 on the curved portion and at a side of the curved portion close to the planar portion 003.

In the array substrate provided by the embodiment of the present disclosure, the correction layer 500 is provided on the pixel defining layer 300 adjacent to the first light emitting unit 240 and close to the side of the planar portion 003 for absorbing and reflecting a longer wavelength light to accelerate the attenuation of the longer wavelength light and solve the phenomenon that the color of the curved portion of the flexible display panel is abnormal due to the slow attenuation of the longer wavelength light when viewed from the front of the display panel, and to improve the display quality of the flexible display panel.

The various parts of the array substrate provided by the embodiments of the present disclosure will be described in detail below.

The back plate 100 may include a flexible substrate, a semiconductor layer, a TFT layer, a planarization layer, and the like. The semiconductor layer is disposed on the flexible substrate, the TFT layer is disposed at a side of the semiconductor layer away from the flexible substrate, and the planarization layer is disposed at a side of the TFT layer away from the flexible substrate. The semiconductor layer is formed on a glass substrate and patterned during fabrication, and then, a gate insulating layer, a gate layer, an interlayer insulating layer, a source/drain metal layer, and a planarization layer are sequentially formed on the semiconductor layer. In actual application, the back plate 100 may further include other layers, and the embodiments of the present disclosure are not limited thereto.

The light emitting layer 200 includes a first electrode 210, a luminescent material layer 220, and a second electrode 230. The first electrode 210 is disposed on the back plate 100, the luminescent material layer 220 is disposed at a side of the first electrode 210 away from the back plate 100, and the second electrode 230 is disposed at a side of the luminescent material layer 220 away from the first electrode 210. The first electrode 210 may be an anode, the luminescent material layer 220 may be an organic electroluminescent layer 200, and the second electrode 230 may be a cathode.

The pixel defining layer is disposed at a first surface of the back plate 100, and the light emitting layer 200 is at least divided into a first light emitting unit 240 and a second light emitting unit 250, wherein the wavelength of the light emitted by the first light emitting unit 240 is greater than the wavelength of the light emitted by the second light emitting unit 250. For example, in practical applications, the pixel defining layer 300 generally divides one pixel into three pixel units of a red light unit, a green light unit, and a blue light unit. The wavelength of the red light is greater than that of the green light and the blue light. The first light emitting unit 240 may be a red light unit. The second electrode 230 is a common electrode that may cover the luminescent material layer 220 and the pixel defining layer 300.

Further, the array substrate further includes a first protective layer 400 disposed at a side of the light emitting layer 200 away from the back plate, and the correction layer 500 is disposed at a side of the light emitting layer 200 away from the back plate 100.

In order to speed up the attenuation of the longer wavelength light, the correction layer 500 may be disposed at a side of the first protective layer 400 away from the pixel defining layer 300 in the first projection area, wherein the first projection area is a projection of the first pixel defining region 310 on the first protective layer 400, and the first pixel defining region 310 is a pixel defining layer 300 adjacent to the first light emitting unit 240 on the curved portion and a side of the curved portion close to the planar portion 003. The longer wavelength light is absorbed and reflected by the correction layer 500 to accelerate the attenuation of the longer wavelength light and solve the problem of an abnormally colored display.

The material of the correction layer 500 may be a cathode metal layer. For example, the material of the correction layer 500 may include at least one of magnesium and silver formed on the first protective layer 400 by evaporation, and the evaporation thickness of the correction layer 500 is 3~8 nanometers (nm). The correction layer 500 may be applied to the entire first projection area or to a part of the first projection area, which is not specifically limited in the embodiment of the present disclosure.

Figure 4:
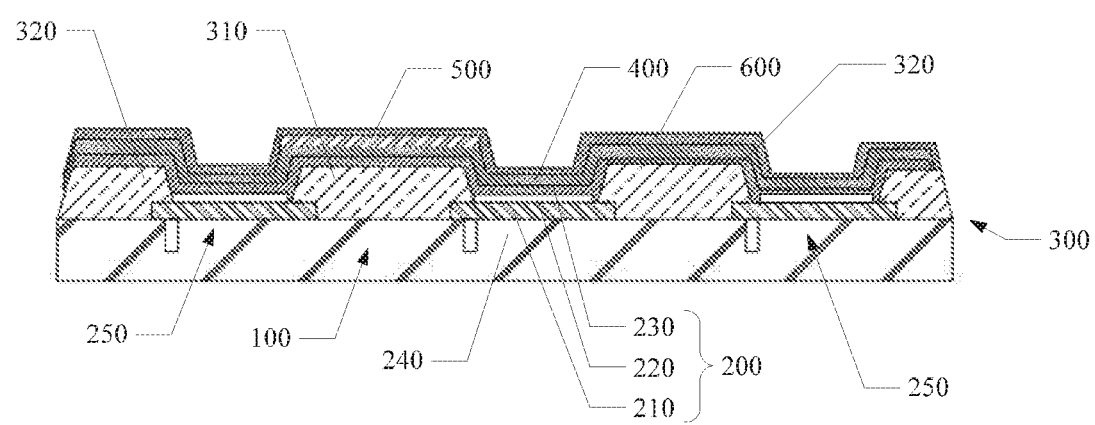
FIG. 4 is a schematic structural view of a right curved portion of an array substrate according to an embodiment of the present disclosure.

By way of example, in the flexible display panel described in FIG. 2, as shown in FIG. 3, the correction layer 500 is disposed above the projection area of the right pixel defining layer 300 of the red light unit located at the left curved portion 001 on the first protective layer 400. As shown in FIG. 4, the correction layer 500 is disposed above the projection area of the left pixel defining layer 300 of the red light unit located at the right curved portion 002 on the first protective layer 400.

It should be noted that the curved portion of the display panel has a plurality of pixels distributed in an array, and each of pixels includes red, green, and blue light emitting units, and the correction layer 500 may be disposed above the pixel defining layer 300 at a side of each red light unit close to the planar portion 003.

It can be seen from FIG. 1 that the attenuation rate of the green light is smaller than the attenuation rate of the blue light, so that the correction layer 500 may be disposed at the side of the first protective layer 400 in the second projection area away from the pixel defining layer 300. The second projection area is a projection of the second pixel defining region 320 on the first protective layer 400, and the second pixel defining region 320 is a pixel defining layer 300 adjacent to the green light unit on the curved portion and at a side of the curved portion close to the planar part 003.

Further, the array substrate further includes: a second protective layer 600 disposed on a side of the correction layer 500 away from the first protective layer 400. The material of the first protective layer 400 may be silicon oxide or silicon oxynitride, and the material of the second protective layer 600 may be silicon oxide or silicon oxynitride. The materials of the first protective layer 400 and the second protective layer 600 may be the same or may be different. In practical applications, in order to facilitate fabrication, materials of the first protective layer 400 and the second protective layer 600 may be selected to be the same. For example, both materials of the first protective layer 400 and the second protective layer 600 are silicon oxynitride.

The first protective layer 400 and the second protective layer 600 may be formed by vapor deposition, wherein the first protective layer 400 may have a thickness of 10 to 300 nm, and the second protective layer 600 may have a thickness of 300 to 1500 nm.

Figure 5:
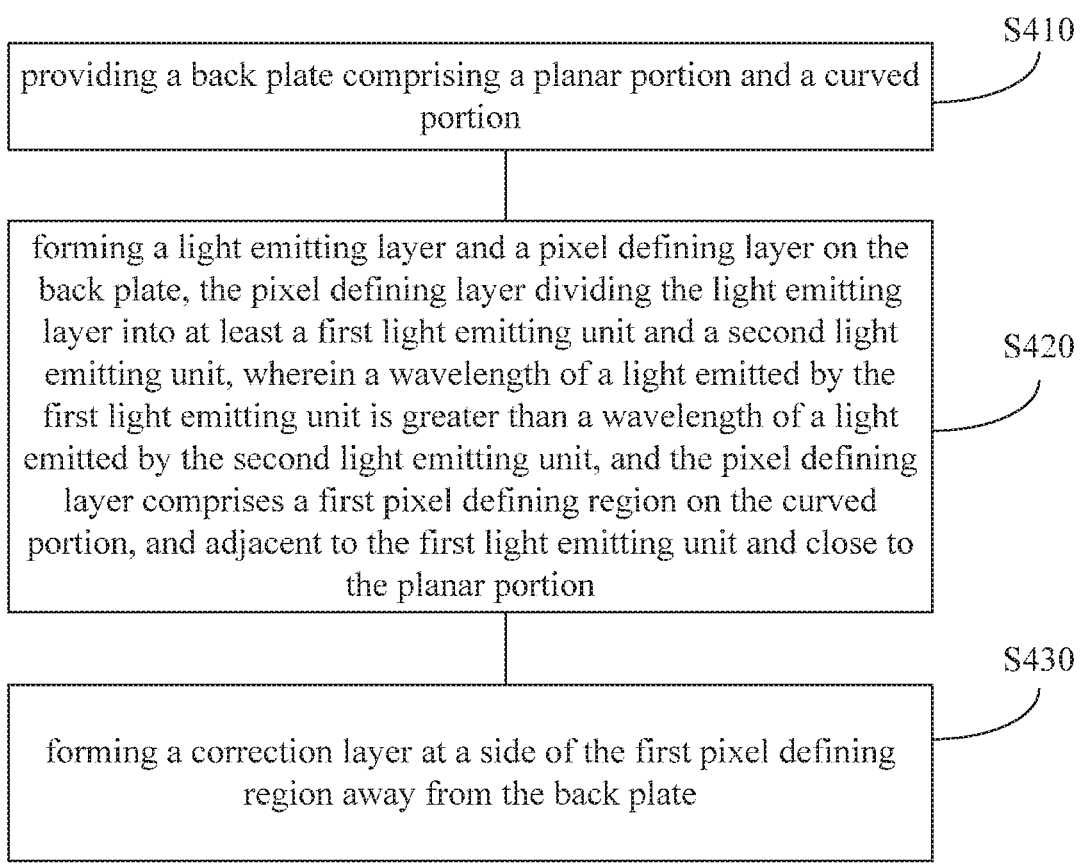
FIG. 5 is a flowchart of a fabricating method of an array substrate according to an embodiment of the present disclosure.

The embodiment of the present disclosure further provides a fabricating method of an array substrate. As shown in FIG. 5, the fabricating method includes:

S410: providing a back plate including a planar portion 003 and a curved portion;

S420: forming a light emitting layer and a pixel defining layer on the back plate, the light emitting layer 200 being at least divided into a first light emitting unit 240 and a second light emitting unit 250, wherein a wavelength of light emitted by the first light emitting unit 240 is greater than a wavelength of light emitted by the second light emitting unit 250;

S430: forming a correction layer at a side of the first pixel defining region 310 away from the back plate, wherein the first pixel defining region 310 is a pixel defining layer adjacent to the first light emitting unit 240 on the curved portion and at a side of the curved portion close to the plane portion 003.

The array substrate manufacturing method provided by the embodiment of the present disclosure is configured to provide a correction layer 500 on the pixel defining layer 300 adjacent to the first light emitting unit 240 and close to the side of the planar portion 003, where the correction layer 500 absorbs and reflects longer wavelength light to accelerate the longer wavelength attenuation, and to solve the phenomenon that the color of the curved portion of the flexible display panel is abnormal due to the slow attenuation of longer wavelength light when viewed from the front of the display panel, and thus, the display quality of the flexible display panel is improved.

Figure 6:
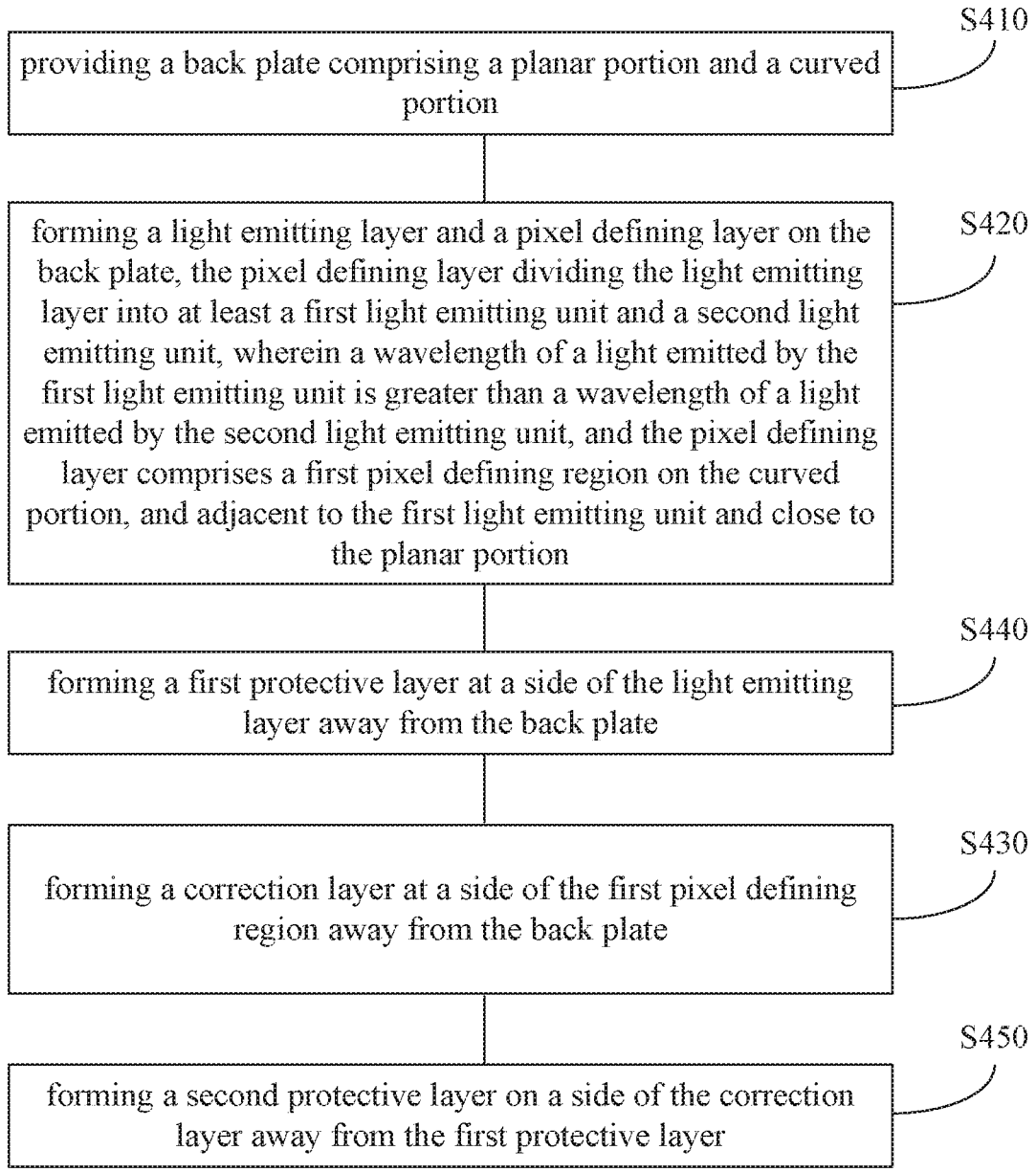
FIG. 6 is a flowchart of another fabricating method of an array substrate according to an embodiment of the present disclosure.

Further, as shown in FIG. 6, the fabricating method of the array substrate further includes:

S440: forming a first protective layer at a side of the light emitting layer away from the back plate;

S450: forming a second protective layer at a side of the correction layer away from the first protective layer.

The S430 may be performed between S440 and S450.

The fabricating method of the array substrate provided by the embodiment of the present disclosure will be described in detail below.

In S410, a back plate 100 is provided, including a planar portion 003 and a curved portion. The back plate 100 may include a flexible substrate, a semiconductor layer, a TFT layer, a planarization layer, and the like. The semiconductor layer is disposed on the flexible substrate, the TFT layer is disposed at a side of the semiconductor layer away from the flexible substrate, and the planarization layer is disposed at a side of the TFT layer away from the flexible substrate. The semiconductor layer is formed on the glass substrate and patterned during fabrication, and then, a gate insulating layer, a gate layer, an interlayer insulating layer, a source/drain metal layer, and a planarization layer are sequentially formed on the semiconductor layer. In actual application, the back plate 100 may further include other layers, and the embodiments of the present disclosure are not limited thereto.

In S420, a light emitting layer 200 and a pixel defining layer 300 are formed on the back plate 100, and the pixel defining layer 300 divides the light emitting layer 200 into at least a first light emitting unit 240 and a second light emitting unit 250, wherein the wavelength of the light emitted by the first light emitting unit 240 is greater than the wavelength of the light emitted by the second light emitting unit 250.

The light emitting layer 200 includes a first electrode 210, a luminescent material layer 220, and a second electrode 230. The first electrode 210 is disposed on the back plate 100, the luminescent material layer 220 is disposed at a side of the first electrode 210 away from the back plate 100, and the second electrode 230 is disposed at a side of the luminescent material layer 220 away from the first electrode 210. The first electrode 210 may be an anode, the luminescent material layer 220 may be an organic electroluminescent layer 200, and the second electrode 230 may be a cathode. In practical applications, the first electrode 210 and the luminescent material layer 220 may be formed on the back plate 100, and then, the pixel defining layer 300 may be disposed on the back plate 100. The pixel defining layer 300 surrounds the luminescent material layer 220, and finally, a second electrode 230 is formed at a side of the luminescent material layer 220 and the pixel defining layer 300 away from the back plate 100.

The light defining layer is disposed on the first surface of the back plate 100, and the light emitting layer 200 is at least divided into a first light emitting unit 240 and a second light emitting unit 250, where the wavelength of the light emitted by the first light emitting unit 240 is greater than the wavelength of the light emitted by the second light emitting unit 250. For example, in practical applications, the pixel defining layer 300 generally divides one pixel into three pixel units of a red light unit, a green light unit, and a blue light unit. The wavelength of the red light is greater than that of the green light and the blue light, and the first light emitting unit 240 may be red light unit.

In S440, a first protective layer 400 is formed at a side of the light emitting layer 200 away from the back plate 100.

The material of the first protective layer 400 may be silicon oxide or silicon oxynitride, which is formed by vapor deposition, and may have a thickness of 10 to 300 nm.

In S430, a correction layer 500 is formed at a side of the first protective layer 400 of the curved portion away from the pixel defining layer 300 in the first projection area, which is a projection of the first pixel defining region 310 on the first protective layer 400. The first pixel defining region 310 is a pixel defining layer 300 adjacent to the first light emitting unit 240 and a side close to the planar portion 003.

The step of forming the correction layer 500 at the side of the first protective layer 400 of the curved portion away from the pixel defining layer 300 may include:

performing magnesium or silver evaporation at a side of the first projection region of the first protective layer 400 away from the pixel defining layer 300 to form the correction layer 500.

The material of the correction layer 500 may be a cathode metal layer. For example, the material of the correction layer 500 may include at least one of magnesium and silver, formed on the first protective layer 400 by evaporation, and the evaporation thickness of the correction layer 500 is 3~8 nanometers. The correction layer 500 may be applied to the entire first projection area or to a part of the first projection area, which is not specifically limited in the embodiment of the present disclosure.

For example, in the flexible display panel described in FIG. 2, as shown in FIG. 3, a correction layer 500 is disposed above the projection area of the right pixel defining layer 300 of the red light unit located at the left curved portion on the first protective layer 400. As shown in FIG. 4, the correction layer 500 is provided above the projection area of the left pixel defining layer 300 of the red light unit located at the right curved portion on the first protective layer 400.

It should be noted that the curved portion of the display panel has a plurality of pixels distributed in an array, and each of the pixels includes red, green, and blue light emitting units, and the correction layer 500 may be disposed above the pixel defining layer 300 at a side of each red light unit close to the planar portion 003.

The attenuation rate of the green light is less than the attenuation rate of the blue light. Therefore, the correction layer 500 may be disposed at a side of the first protective layer 400 in the second projection area away from the pixel defining layer 300. The second projection area is defined as a projection of the second pixel defining region 320 on the first protective layer 400, and the second pixel defining region 320 is a pixel defining layer 300 adjacent to the green light unit on the curved portion and a side close to the planar portion 003.

In S450, a second protective layer 600 is formed on a side of the correction layer 500 away from the first protective layer 400.

The material of the second protective layer 600 may be silicon oxide or silicon oxynitride, formed by vapor deposition, and may have a thickness of 300 to 1500 nm.

It should be noted that, although various steps of the method of the present disclosure are described in a particular order in the drawings; however, it does not require or imply that the steps must be performed in the specific order, or that all the steps must be performed to achieve the desired results. Additionally or alternatively, certain steps may be omitted, multiple steps may be combined into one step, and/or one step may be decomposed into multiple steps.

Embodiments of the present disclosure also provide a display device including the above-mentioned array substrate. In practical applications, the display device may further include components, such as a driving circuit, a PCB board, and a glass cover. As these components are understood in the art, the embodiments of the present disclosure are not described herein. The display device may include, for example, a mobile phone, a tablet computer, a television, a notebook computer, a digital photo frame, a navigator, or any other product or component having a display function.

The above-described drawings are merely illustrative of the processes included in the method according to the exemplary embodiments of the present invention, and are not intended to be limited. In order to easily understand, processes shown in the above drawings do not indicate or limit the time sequence of these processes.

Other embodiments of the present disclosure will be apparent to those skilled in the art after reading the specification and implementing the present disclosure disclosed herein. The present application is intended to cover any variations, purposes, or adaptations of the present disclosure, which are in accordance with the general principles of the present disclosure and include common general knowledge or conventional technical means in the art that are not disclosed in the present disclosure. The specification and embodiments are to be regarded as illustrative only, and the real scope and spirit of the present disclosure is defined by the attached claims.

What is claimed is:

1. An array substrate comprising:
a back plate comprising a planar portion and a curved portion;
a light emitting layer at a first surface of the back plate, the light emitting layer comprising first light emitting units and second light emitting units that are spaced apart from each other, and a wavelength of a light emitted by the first light emitting unit being greater than a wavelength of a light emitted by the second light emitting unit;

a pixel defining layer at a first side of the back plate and between the first light emitting unit and the second light emitting unit, the pixel defining layer comprising a first pixel defining region on the curved portion, and adjacent to the first light emitting unit and close to the planar portion; and a correction layer at a side of the first pixel defining region away from the back plate for absorbing and reflecting the light emitted by the first light emitting unit.

2. The array substrate according to claim 1, wherein the first light emitting unit is a red light unit.

3. The array substrate according to claim 1 further comprising:

a first protective layer at a side of the light emitting layer away from the back plate, the correction layer being disposed at the side of the light emitting layer away from the back plate.

4. The array substrate according to claim 3, further comprising: a second protective layer at a side of the correction layer away from the first protective layer.

5. The array substrate according to claim 1, wherein a material of the correction layer comprises at least one of magnesium and silver.

6. The array substrate according to claim 5, wherein the correction layer has a thickness of 3 to 8 nm.

7. The array substrate according to claim 4, wherein the first protective layer has a thickness of 10 to 300 nm.

8. The array substrate according to claim 7, wherein the second protective layer has a thickness of 300 to 1500 nm.

9. A display device comprising:

an array substrate, comprising:

a back plate comprising a planar portion and a curved portion;

a light emitting layer at a first surface of the back plate, the light emitting layer comprising first light emitting units and second light emitting units that are spaced apart from each other, and a wavelength of a light emitted by the first light emitting unit being greater than a wavelength of a light emitted by the second light emitting unit;

a pixel defining layer at a first side of the back plate and between the first light emitting unit and the second light emitting unit, the pixel defining layer comprising a first pixel defining region on the curved portion, and adjacent to the first light emitting unit and close to the planar portion; and a correction layer at a side of the first pixel defining region away from the back plate for absorbing and reflecting the light emitted by the first light emitting unit.

10. The display device according to claim 9, wherein the first light emitting unit is a red light unit.

11. The display device according to claim 9, further comprising: a first protective layer at a side of the light emitting layer away from the back plate, the correction layer being disposed at the side of the light emitting layer away from the back plate.

12. The display device according to claim 11, further comprising: a second protective layer at a side of the correction layer away from the first protective layer.

13. The display device according to claim 9, wherein a material of the correction layer comprises at least one of magnesium and silver.

14. The display device according to claim 12, wherein the correction layer has a thickness of 3 to 8 nm, a first protective layer has the thickness of 10 to 300 nm, a second protective layer has the thickness of 300 to 1500 nm.

* * * * *